United States Patent [19]

Trofimenkoff et al.

[11] Patent Number: 4,558,301

[45] Date of Patent: Dec. 10, 1985

[54] VOLTAGE-TO-FREQUENCY AND ANALOG-TO-DIGITAL CONVERTER CIRCUIT

[75] Inventors: Frederick N. Trofimenkoff, Calgary, Canada; Jai Bhagwan, c/o Dept. of Elec. Engg., University of Calgary, Calgary, Alberta, T2N 1N4, Canada; Sandro P. Poscente, 3383 Breton Cl. NW., Calgary, Alberta, T2L iX3, Canada

[73] Assignees: Trofimenkoff Engineering, Ltd., Alberta; Jai Bhagwan, Montreal; Sandro Poscente; Governors of the University of Calgary, both of Calgary, all of Canada

[21] Appl. No.: 394,170

[22] Filed: Jul. 1, 1982

[51] Int. Cl.$^4$ ............................................. H03K 13/20
[52] U.S. Cl. ....................... 340/347 AD; 340/347 NT
[58] Field of Search ................. 340/347 NT, 347 AD; 364/835, 472

[56] References Cited

U.S. PATENT DOCUMENTS

| 3,230,358 | 1/1966 | Davis | 364/835 |
|---|---|---|---|
| 3,465,134 | 9/1969 | James | 364/835 |
| 3,538,317 | 11/1970 | Fukuda | 364/835 |
| 4,083,044 | 4/1978 | Marshall | 340/347 NT |
| 4,092,726 | 5/1978 | Schaeff | 340/347 NT |
| 4,110,746 | 8/1978 | Furukawa | 340/347 NT |
| 4,136,396 | 1/1979 | Hansford | 340/347 SH |
| 4,149,256 | 4/1979 | Sumi | 340/347 SH |
| 4,191,942 | 3/1980 | Long | 340/347 NT |
| 4,366,874 | 1/1983 | Pidoux | 340/347 NT |
| 4,390,864 | 6/1983 | Ormond | 340/347 AD |

OTHER PUBLICATIONS

Chauvel, "Produce an Analog-Digital Converter with a TMS 1000 Microcomputer", Electron. & Appl. Ind., No. 232, (Mar. 1, 1977), pp. 43–45.
Taylor, "A Current-to-Frequency Converter for Astronomical Photometry", The Review of Scientific Instruments, vol. 40, No. 4, Apr. 1969, pp. 559–562.

Primary Examiner—Charles D. Miller
Attorney, Agent, or Firm—Shlesinger Arkwright Garvey & Fado

[57] ABSTRACT

A voltage-to-frequency and analog-to-digital conversion circuit using a microprocessor-controlled capacitor charge-discharge scheme provides high resolution and low component count and is particularly suitable for use with resistance bridge transducers.

2 Claims, 3 Drawing Figures 4,558,301

VOLTAGE-TO-FREQUENCY AND ANALOG-TO-DIGITAL CONVERTER CIRCUIT

BACKGROUND OF THE INVENTION

This invention relates to microprocessor controlled capacitor charge-discharge voltage-to-frequency converters and analog-to-digital converters that are particularly suitable for use with resistance bridge transducers.

Within the last ten years, circuits have been proposed for analog-to-digital conversion in which the charging and discharging of a capacitor in an integrator circuit has been used to obtain values which are proportional to the input signal voltage and which are independent of long term changes in capacitor characteristics. One such circuit is disposed in the patent to Schmidhauser U.S. Pat. No. 3,693,843. This patent discloses the use of the technique of charging the feedback capacitor used in an integrator circuit at a rate proportional to an input signal voltage and discharging it as required using a reference discharge pulse to maintain the total change in the charge on the capacitor at essentially zero. When a steady-state is reached, the frequency of the pulse train is proportional to the input signal voltage and the arrangement is a voltage-to-frequency converter. The ratio of the number of discharge pulses applied to the feedback capacitor in a measurement period to the maximum number of discharge pulses that can be applied in the measurement period is proportional to the value of the input signal voltage. When used in this mode, the circuit functions as an analog-to-digital converter.

There are many uses for voltage-to-frequency and analog-to-digital conversion circuits of this type but limitations of size and circuit complexity of the previously designed circuits are a drawback to widespread application of this technique. One such need for improved circuits is in the petroleum industry where down hole pressure and temperature measurements are frequently made using resistance bridge transducers. In this application, circuits with a small number of components, small physical size, low-power consumption from a single polarity power supply, high resolution high accuracy and the capability of functioning over a wide ambient temperature range are required.

SUMMARY OF INVENTION

Accordingly, it is one of the principal features of this invention to provide an improved microprocessor-controlled capacitor charge-discharge voltage-to-frequency and analog-to-digital conversion circuit.

Another feature of this invention is to provide a voltage-to-frequency and analog-to-digital conversion circuit that can be used directly with resistance bridge transducers.

A still further feature of this invention is to provide a voltage-to-frequency and analog-to-digital conversion circuit that can be operated in conjunction with resistance bridge transducers using only one polarity of supply voltage for the complete system.

A still further feature of this invention is to provide a voltage-to-frequency and analog-to-digital conversion circuit which, when used with a resistance bridge transducer, will result in an overall measurement system which is independent of small changes in the supply voltage, that is, the system will be of the resistance ratioing type.

It is a still further feature of this invention to provide a voltage-to-frequency and analog-to-digital conversion circuit with fewer components than previously developed circuits.

It is a still further feature of this invention to provide a voltage-to-frequency and analog-to-digital conversion circuit that can be operated over a broad temperature range.

It is a still further feature of this invention to provide a plural channel capability using a small number of components, the channels of which are used with a common microprocessor.

It is a still further feature of this invention to provide a single circuit that can be selected to function either as a voltage-to-frequency converter or an analog-to-digital converter by changing only the software.

It is a still further feature of this invention to provide an analog-to-digital conversion circuit in which resolution can be made dependent on software.

It is a still further feature of this invention to provide an analog-to-digital conversion circuit that averages the input signal voltage over the duration of the measurement period.

It is a still further feature of this invention to provide a voltage-to-frequency converison circuit that is controlled by a crystal clock and a analog-to-digital conversion circuit which is not affected by long term variations in the crystal clock frequency.

These and further features of this invention will become apparent from the following description of the drawings.

DESCRIPTION OF THE INVENTION

Figure 1:
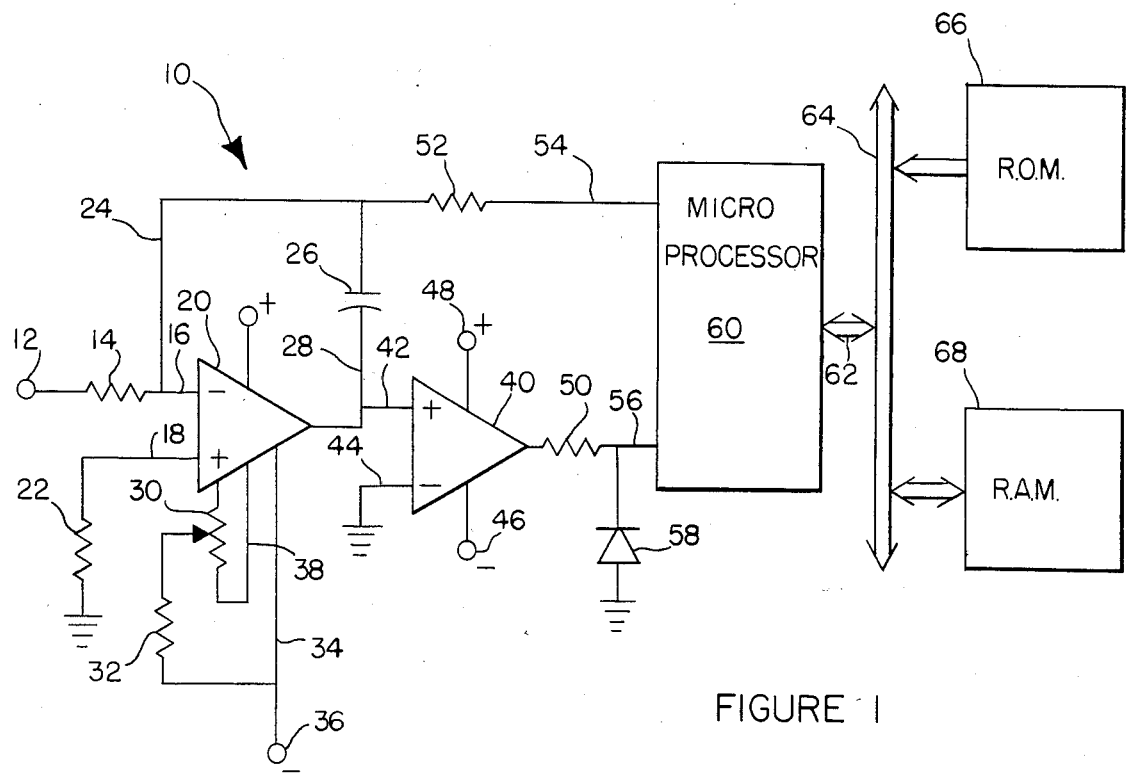
FIG. 1 shows a voltage-to-frequency and analog-to-digital converter circuit as used with a microprocessor system.

The invention contemplates a circuit configuration for an integrator type-charge-discharge circuit in which a microprocessor can effectively be used to provide an accurately controlled train of restoring reference discharge pulses to discharge the feedback capacitor of the integrator circuit.

An analog signal input is applied to terminal 12 which passes through input resistor 14 and line 16 to the operational amplifier 20 of the integrator circuit. Line 16 is connected to the negative terminal of the operational amplifier 20, and ground line 18 connects the positive terminal of the operational amplifier 20 to ground through the input bias current compensation resistor 22.

The integrator section includes operational amplifier 20 and a feedback line 24 containing the feedback capacitor 26. The feedback line is connected to the negative input terminal of the operational amplifier 20 in parallel with the analog voltage input line 16. The output line 28 of the operational amplifier 20 is connected to the second plate of the feedback capacitor 26. Amplifier offset voltage is controlled through adjustable resistance 30, and fixed resistors 32, which are connected through line 32 to negative voltage terminal 36.

The comparator circuit includes the operational amplifier 40, which has its positive terminal connected through line 42 to the output line 28 of the integrator circuit. Its negative terminal is connected to ground through line 44. Terminals 46 and 48 provide negative and posive power supply connections to the operational amplifier 40, respectively. The comparator senses the output from the integrator and passes on either a 1 or a 0 through the resistor 50 and line 56 to the microprocessor 60.

The microprocessor 60 on sensing the existence of a 1 is programmed to send out a positive reference discharge pulse along line 54 and through reference resistor 52 to discharge the negative plate of feedback capacitor 26.

The microprocessor 60 is an RCA CDP1802 microprocessor. It has its flag terminal connected to line 56 which is connected in parallel to the diode 58. The bus 64 connected to the microprocessor through lines 62 serves the read only memory unit 66 and the random access memory unit 68.

The above circuit is a voltage-to-frequency converter which will also provide analog-to-digital conversion. In this circuit the negative analog input voltage is integrated until the comparator produces a digital 1 at its output terminal. This is sensed by the microprocessor 60 at its flag input terminal connected to line 56, and a reference pulse appears at the Q output of the microprocessor and is carried along line 54. With the application of the positive pulse, a sufficient amount of charge is removed from the feedback capacitor to return the comparator output to a digital 0. With the continued application of an analog input voltage to terminal 12, and the attainment of a steady-state, the number of reference pulses per unit time supplied by the microprocessor will be proportional to the analog input voltage.

For a steady state charge balance of the feedback capacitor 26, where the reference or restoring pulse amplitude is $V_p$ (assuming that the integrator is ideal), the frequency of the reference pulse is:

$$F = - \frac{V_{in} R_p}{V_p R_{in} T_p}$$

where $R_p$ is resistance 52 and $R_{in}$ is resistance 14 of FIG. 1. $T_p$ is the reference pulse duration time. It should be noted that the frequency of theses pulses is independent of the value of the feedback capacitor 26. Since a microprocessor is involved in controlling the train of pulses, and the microprocessor can be crystal-controlled, the circuit can thus be used as a crystal-controlled voltage-to-frequency converter.

When the integrator amplifier has an input offset voltage as well as input bias currents, the fraction of a cycle when the restoring pulse can be on should be as large as possible. There is a limit to the magnitude of this fraction when a microprocessor is used since there are a certain number of instructions that must be executed by the microprocessor in each cycle outside the time that the restoring pulse can be on. As an example, a voltage-to-frequency conversion cycle implemented using the RCA CDP 1802 microprocessor operating at a 2 MHz clock rate requires four instructions each of eight microseconds duration and the restoring pulse can be on for two instruction durations. The maximum frequency corresponds to the application of one restoring pulse per cycle and is therefore 31.25 kHz. Since in this case $T_p$ is equal to 2/F, the ratio of $R_i$ to $R_p$ will be constrained to be equal to 2 times the ratio of the maximum input voltage of the voltage $V_p$.

Analog-to-digital conversion is effected by counting the number of restoring pulses N that are required when the processor goes through $N_{max}$ cycles. As an example, an analog-to-digital conversion cycle implemented using the RCA CDP 1802 microprocessor operating at a 2 MHz clock rate requires six instructions each of eight microseconds duration. Thus if $N_{max}$ is taken to be 20,000, the analog-to-digital conversion process will take about 0.96 seconds. In this case, the restoring pulse can be on for a maximum of four instructions durations in each cycle and the ratio of $R_i$ to $R_p$ will be constrained to be equal to 3/2 of the ratio of the maximum input voltage to the voltage $V_p$.

Because both the duration of a test cycle and the duration of the measurement period which consists of $N_{max}$ cycles are controlled by the same crystal clock, the crystal clock needs to be stable only for the duration of the measurement period to obtain high accuracy. Furthermore, since the capacitor is charged by the input signal voltage for the full measurement period during an analog-to-digital conversion operation and since capacitor charging is an averaging process, the circuit averages out all sources of electrical noise with zero mean value.

In those instances where it is desired to reduce the number of components as much as possible, the comparator can be dropped from the circuit. In such a case, the integrator amplifier output must operate around the microprocessor flag threshold and the integrator amplifier must have an output saturation voltage which is higher than the flag threshold voltage value.

In cases where several input voltages are to be digitized, the output of several integrator circuits can be connected each to its own flag input of a multiple flag microprocessor. A restoring pulse can be routed to each integrator circuit and the microprocessor can be programmed to perform an analog-to-digital conversion on each of the input voltages in sequence.

Figure 2:
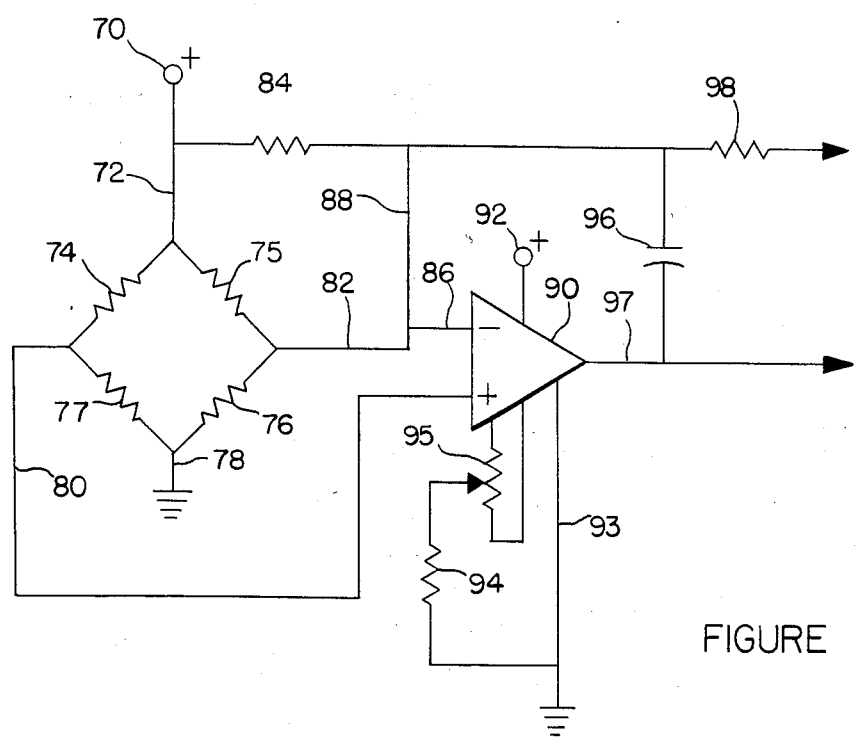
FIG. 2 shows another voltage-to-frequency and analog-to-digital conversion circuit for use with resistance bridge transducers.
Figure 3:
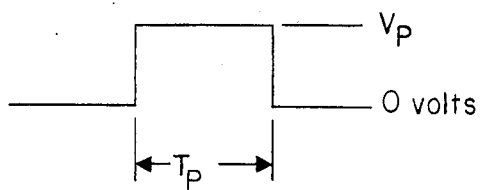
FIG. 3 is a diagram of the reference discharge pulse used with the voltage-to-frequency and analog-to-digital conversion circuits.

FIG. 2 shows the analog portion of a voltage-to-frequency or analog-to-digital conversion circuit wherein the transducer resistance bridge formed by resistors 74, 75 76 and 77 is an integral part of the conversion circuit.

Referring specifically to FIG. 2, 70 discloses a positive analog voltage which is the supply voltage to the transducer bridge, with a line 72 connected to the transducer bridge having resistors 74, 75, 76 and 77 and connected at their far end through lead 78 to ground. The far end of the bridge between resistor 74 and 77 connects to output line 80 while the second output line 82 from the bridge is connected to the junction of resistor 75 and 76.

The operational amplifier 90 has a positive terminal to which the bridge lead 80 is connected, and a negative terminal which is connected through input signal lead 86 to the output lead 82 of the bridge. The input lead 86 is also connected in parallel to the feedback line 88.

The voltage offset adjust resistance network consists of the line 93 which is connected to ground, the fixed resistor 94 and the adjustable resistor 95. Positive voltage terminal 92 is connected to the operational amplifier 90.

One plate of the feedback capacitor is connected to feedback line 88 and the other plate of the feeback capacitor is connected to output line 97 which is also connected to the input test line of the microprocessor, not shown. The reference discharge pulses pass through reference resistor 98 and through the line 88 to the junction of lines 82, 86 and 88.

For proper functioning of the circuit of FIG. 2, the junction of resistors 75 and 76 must be set at a negative potential to the junction of resistors 74 and 77 when the transducer is performing its measuring function. A bridge balancing resistor 84 is connected between line 72 of the transducer bridge and the feedback line 88 can be selected to arrange for the above negative potential difference.

The bridge supply voltage 70 should be equal to the discharge pulse height $V_p$. Under these circumstances, small changes in these voltages will not affect the operation of the circuit.

Insofar as the voltage-to-frequency and analog-to-digital conversion circuit suitable for use with resistance bridge transducers and shown in FIG. 2 is concerned, it provides many distinct advantages. The system supplies a resistance ratio arrangement, a crystal controlled voltage-to-frequency conversion capability, multichannel usage with one microprocessor providing the central control, analog-to-digital conversion with resolution which can be determined by software where tradeoff between resolution and converstion time can be made, low component count for the system, single ended supply operation, and low power consumption. Furthermore, because CMOS microprocessors such as the RCA CDP 1802 can be operated over a broad temperature range, and because only one amplifier capable of operating at high temperatures is required per input channel, the complete transducer and voltage-to-frequency or analog-to-digital conversion system can be operated over a broad temperature range.

What is claimed is:

1. An voltage-to-frequency and analog-to-digital converter circuit, comprising:
   (a) an integrator circuit including an operational amplifier having positive and negative input terminals and an output line,
   (b) the integrator circuit having a feedback line which contains a feedback capacitor and is connected between the output line and the negative operational amplifier input terminal,
   (c) an analog signal input line, which contains an input resistance, and is connected in parallel with the feedback line and said terminal,
   (d) a reference signal line which contains a reference resistance, and is connected in parallel with the feedback and analog signal input line,
   (e) a line containing a compensation resistor connected to the positive operational amplifier input terminal,
   (f) the value of the compensation resistor being equal to the parallel resistance value of the input and the reference resistances,
   (g) microprocessor means having a flag input connected to the operational amplifier circuit output line and also a reference pulse Q output connected to the other end of the reference signal line for supplying a train of positive pulses which discharge the feedback capacitor,
   (h) the microprocessor means comparing the output signal from the operational amplifier circuit to a predetermined reference level value to initiate a standard test period control pulse when the reference level value is exceeded and simultaneously triggering a reference discharge pulse during such test period and transmitting it along the reference pulse output line and across the reference resistance to the negative operational amplifier input terminal to discharge the feedback capacitor for providing a time rate of reference pulses which is proportional to the analog input signal, where the pulse frequency is equal to the product of the input voltage and reference resistance value divided by the product of the restoring pulse voltage, the input resistance and the reference pulse duration time, and
   (i) the microprocessor means for counting the number of reference discharge pulses that are required in a measurement period made up of a predetermined number of test periods to provide a digital representation of the analog input voltage.

2. A voltage-to-frequency and analog-to digital converter for use with resistance bridge transducer, comprising:
   (a) an integrator circuit including an operational amplifier having positive and negative input terminals and an output line,
   (b) the integrator circuit having a feedback line which contains a feedback capacitor and is connected between the output line and the negative operational amplifier input terminal,
   (c) an analog signal input line connecting one of the transducer resistance bridge output lines to the negative operational amplifier input terminal,
   (d) a second analog signal input line connecting the other transducer resistance bridge output line to the positive operational amplifier input terminal,
   (e) a reference signal line, which contains a reference resistance and is connected in parallel with the feedback line and the analog input line connected to the negative operational amplifier input terminal,
   (f) a bridge balancing resistance connected between the negative operational amplifier input terminal and the transducer resistance bridge supply voltage terminal,
   (g) microprocessor means having a flag input connected to the operational amplifier circuit output line and also a reference pulse Q output connected to the other end of the reference signal line for supplying a train of positive pulses which discharge the feedback capacitor,
   (h) the microprocessor means comparing the output signal from the operational amplifier circuit to a predetermined reference level value to initiate a standard test period control pulse when the reference level value is exceeded and simultaneously triggering a reference discharge pulse during such test period and transmitting it along the reference pulse output line and across the reference resistance to the negative operational amplifier input terminal to discharge the feedback capacitor for providing a time rate of reference pulses which is proportional to the analog input signal, where the pulse frequency is equal to the product of the input voltage and reference resistance value divided by the product of the restoring pulse voltage, the input resistance and the reference pulse duration time,
   (i) the microprocessor means for counting the number of reference discharge pulses that are required in a measurement period made up of a predetermined number of test periods to provide a digital representation of the analog input voltage, and
   (j) the output saturation voltage of the amplifier being greater than the microprocessor flag threshold, and the microprocessor operating at approximately the flag threshold.

* * * * *